United States Patent [19]

Kosak

[11] Patent Number: 4,629,907

[45] Date of Patent: Dec. 16, 1986

[54] DEVICE FOR MONITORING THE FUNCTION OF ELECTRONIC EQUIPMENT, IN PARTICULAR MICROPROCESSORS

[75] Inventor: Wolfgang Kosak, Möglingen, Fed. Rep. of Germany

[73] Assignee: Robert Bosch GmbH, Stuttgart, Fed. Rep. of Germany

[21] Appl. No.: 839,816

[22] Filed: Mar. 12, 1986

Related U.S. Application Data

[63] Continuation of Ser. No. 515,429, Jul. 20, 1983.

[30] Foreign Application Priority Data

Jul. 23, 1982 [DE] Fed. Rep. of Germany ....... 3227546
Jun. 21, 1983 [DE] Fed. Rep. of Germany ....... 3322242

[51] Int. Cl.[4] ........................ F02D 31/00; H03K 5/22

[52] U.S. Cl. .................................... 307/265; 307/273; 307/362; 307/592; 328/34; 328/59; 328/111; 364/431.11; 364/184; 371/12

[58] Field of Search ............... 307/234, 265, 273, 518, 307/354, 362, 350, 363, 296 R, 296 A, 603, 592; 365/226, 228; 364/183, 707, 431.11, 200, 900, 550, 551; 371/12, 62; 328/120, 34, 59, 109, 111

[56] References Cited

U.S. PATENT DOCUMENTS

| | | | |
|---|---|---|---|
| 3,315,246 | 4/1967 | Huffman et al. | 328/120 |
| 4,245,315 | 1/1981 | Barman et al. | 364/431 |
| 4,414,623 | 11/1983 | Davis et al. | 364/200 |
| 4,429,366 | 1/1984 | Kennon | 364/482 |
| 4,434,403 | 2/1984 | Chang | 328/120 |
| 4,541,050 | 9/1985 | Honda et al. | 364/424 |

FOREIGN PATENT DOCUMENTS

| | | | |
|---|---|---|---|
| 56-52452 | 5/1981 | Japan | 371/12 |
| 2035633 | 6/1980 | United Kingdom | 371/12 |
| 2072883 | 10/1981 | United Kingdom | 364/184 |

*Primary Examiner*—Stanley D. Miller
*Assistant Examiner*—Richard Roseen
*Attorney, Agent, or Firm*—Edwin E. Greigg

[57] ABSTRACT

A device is proposed for monitoring the function of electronic equipment, in particular equipment controlled by microprocessors. In such devices, the regular occurrence of control pulses is monitored in that a capacitor which can be charged or discharged in accordance with the control pulses is connected to a threshold stage, which in the case of a persistent absence of control pulses generates a signal having a reset phase of predetermined duration and an active phase also of predetermined duration for the equipment in a periodic sequence. The durations, of the reset phase and the active phase are freely selectable independently of one another, the duration of the active phase preferably being substantially shorter than that of the reset phase.

15 Claims, 3 Drawing Figures

DEVICE FOR MONITORING THE FUNCTION OF ELECTRONIC EQUIPMENT, IN PARTICULAR MICROPROCESSORS

This is a continuation of copending application Ser. No. 515,429 filed July 20, 1983.

BACKGROUND OF THE INVENTION

The invention is directed to an improved apparatus for monitoring and controlling electronic equipment, especially in an emergency operation mode, wherein a microprocessor fails to supply a normal operation signal to operate that equipment.

In electronic equipment controlled by microprocessors, it is known to provide monitoring devices which monitor the correct functioning of the equipment and emit an alarm signal and/or furnish an emergency control in the event of a malfunction.

It is known in this respect to generate control pulses in a regular time sequence which serve as an indication that the equipment is functioning properly. In equipment controlled by microprocessors, these control pulses may for instance be generated by incorporating such control pulses in the control program of the microprocessor, so that in the event of program malfunctions (for instance, a shutdown of the calculator), no further control pulses are emitted.

A reset circuit for a microcomputer is known from German Offenlegungsschrift No. DE-OS 30 35 896, in which the control pulses indirectly effect the charging or discharging of a capacitor, so that the absence of control pulses can be recognized by monitoring the capacitor voltage. Then in the event that control pulses are absent beyond a predetermined extent, a reset signal is generated, which resets the microcomputer; the reset phase is followed immediately by an active or clearance phase in which the system is capable of starting up again.

The known devices have the disadvantage, however, that if a malfunction occurs either the monitored device is shut down completely or, if a reset and clearance phase is provided, then the prevailing operating conditions may be indefinite.

OBJECT AND SUMMARY OF THE INVENTION

The device according to the invention has the advantage over the prior art in that by setting a definite duration for the reset and active phases, an emergency program for the monitored equipment is made possible. Specifically, if a device of the general type discussed at the outset above is used in a motor vehicle, for instance for controlling an injection system or a means for regulating volumetric efficiency during idling, then in the event of a malfunction in the injection system either no enrichment or full enrichment will be effected, and in regulating the volumetric efficiency during idling either the engine will be starved for air or will speed up to maximum rpm. However, if a predetermined, preferably low duty cycle of the reset phase and the active phase is established with the device according to the invention, the duty cycle preferably being 5%, then the result is emergency operation of the internal combustion engine of the motor vehicle with which it is still possible to maneuver the vehicle.

It is particularly advantageous and simple to charge a storage capacitor directly with the control pulses generated, because few component elements are then required and the likelihood of malfunctioning is still further decreased.

If the duty cycle of the reset and the active phases is defined by means of the stable state of a monostable multivibrator, then a wider range of duty cyles can be set for these phases using circuitry provisions known per se.

A further savings in components and a further increase in operational reliability is attained if the duty cycle is effected directly by especially wiring a threshold stage, which monitors the charge status of the capacitor.

The invention will be better understood and further objects and advantages thereof will become more apparent from the ensuing detailed description of preferred embodiments taken in conjunction with thee drawings.

DESCRIPTION OF THE PREFERRED EMBODIMENTS

Figure 1:
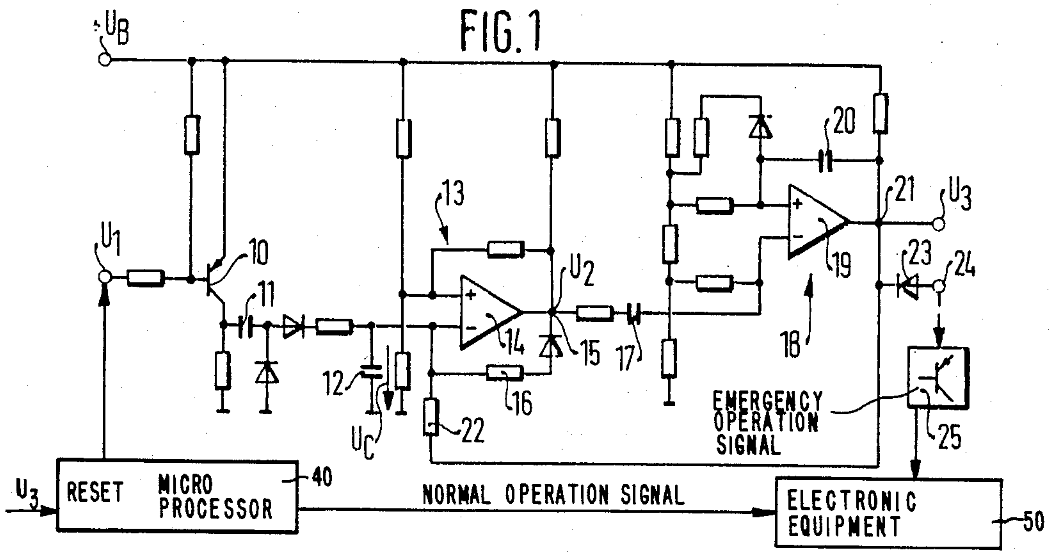
FIG. 1 is a circuit diagram for a first exemplary embodiment of a device according to the invention.

In FIG. 1, in a first exemplary embodiment an electronic circuit is connected between a source of operating voltage $+U_B$ and ground. A unit of equipment is controlled via a microprocessor. The microprocessor generates control pulses at more or less regular intervals, the appearance of which is an indication of proper operation of the equipment control means. These control pulses are shown in FIG. *3a* and designated as $U_1$. The signal $U_1$ is delivered to the input of the circuit according to FIG. 1 and controls a transistor 10, which charges a storage capacitor 12 via a coupling capacitor 11. The storage capacitor 12 is located in an inverting input of a threshold stage 13, which in a manner known per se is represented by an operational amplifier 14 with appropriate wiring. The output 15 of the operational amplifier 14 is negatively coupled with the inverting input having a resistor 16. A signal $U_2$ is present at the output 15, and its course over time is shown in FIG. *3c*. This output signal $U_2$ is carried via a capacitor 17 to a monostable multivibrator 18, which is likewise represented in a manner known per se by an operational amplifier 19 with appropriate wiring. In particular, the output 21 of the operational amplifier 19 is positively coupled via a capacitor 20 with the non-inverting input. The signal present at the output 21 is marked $U_3$ and its course over time is shown in FIG. *3d*. Finally, the output 21 is also connected via a diode 23 with a terminal 24 which in turn is connected to a servo assembly, for example, an end stage 25 that controls equipment in an emergency operation mode which is normally controlled by the microprocessor.

The functioning of the circuit shown in FIG. 1 will now be described, referring to the diagrams of FIG. 3:

In the state of rest of the circuit shown in FIG. 1, the output 15 of the threshold stage 13 is in logical state L, while in contrast the output 21 of the monostable multivibrator 18 is in the logical state H. The storage capacitor 12, the voltage $U_C$ of which is plotted in FIG. *3b*, is now charged via the control pulses $U_1$; naturally, the charge supplied by the control pulses $U_1$ must be greater than the charge flowing out via the resistor 16 to the output 15. As may be seen from FIG. 3*b*, in the period of time between an initial time $t_0$ and a time $t_1$, the capacitor 12 is slowly charged to capacity and then remains in its fully charged state as further control pulses $U_1$ arrive. The final control pulse appears at time $t_2$, since at time $t_3$ a malfunction occurs, lasting for a total period of $T_s$. Now the capacitor 12 discharges via the resistor 16 toward the output 15, until the switch-over condition of the operational amplifier 14, acting as a comparator, is attained at time $t_3$ at a voltage value of $U_{C1}$. The threshold stage 13 now switches over as a whole, causing the output 15 to switch into logical state H and the monostable multivibrator 18 correspondingly to switch with its output into the logical state L, as may be seen from FIGS. 3*c* and 3*d*. A reset phase then follows, which lasts for a period $T_R$, this period being determined by the capacitor 20 of the monostable multivibrator 18. The reset phase of output signal $U_3$ has the purpose of resetting the controlling microprocessor MP or some other such control device as may be in operation. After the ON time or stable state of the monostable multivibrator 18, which corresponds to the period $T_R$, has elapsed, the output 21 of the monostable multivibrator 18 switches back again to logical H, as may be seen from time $t_4$ in FIG. 3*d*. The capacitor 12 can now be charged by the H potential of the output 21 via the resistor 22, as may be seen in the period between time $t_4$ and time $t_5$ of FIG. 3*b*. If the capacitor voltage $U_C$ now exceeds the upper threshold $U_{C2}$, which is the case at time $t_5$, then the threshold stage 13 switches over once again, and its output 15 enters the logical state L, as may be seen in FIG. 3*c*. The capacitor 12 now discharges once again via the resistor 16, until at time $t_6$ the lower threshold voltage $U_{C1}$ has again been attained, so that both the threshold stage 13 and the monostable multivibrator 18 switch over again. The monostable multivibrator 18 will have emitted a logical H signal at its output 21 from time $t_4$ to time $t_6$, which serves to unblock or clear the microprocessor once again.

If a malfunction persists for a long time, that is, if the control pulses $U_1$ continue to be absent, then the sequence described above is repeated periodically, and reset phases for the microprocessor having the duration $T_R$ alternate with active phases for the microprocessor having the duration $T_F$. The result is the establishment of a duty cycle in which during the one phase ($T_R$) the microprocessor is reset and the controlled equipment does not operate, while in the other phase ($T_F$) the controlled equipment is operated. The result is effectively a duty cycle for the controlled equipment which may be dimensioned such that at least emergency operation of the equipment is possible.

If the device according to the invention is used for instance in a motor vehicle for controlling an injection system or the regulation of the volumetric efficiency during idling, then given a preselected duty cycle of 5%, for example, the vehicle engine speed will be within a range in which an rpm sufficient for emergency operation is established.

Figure 3:
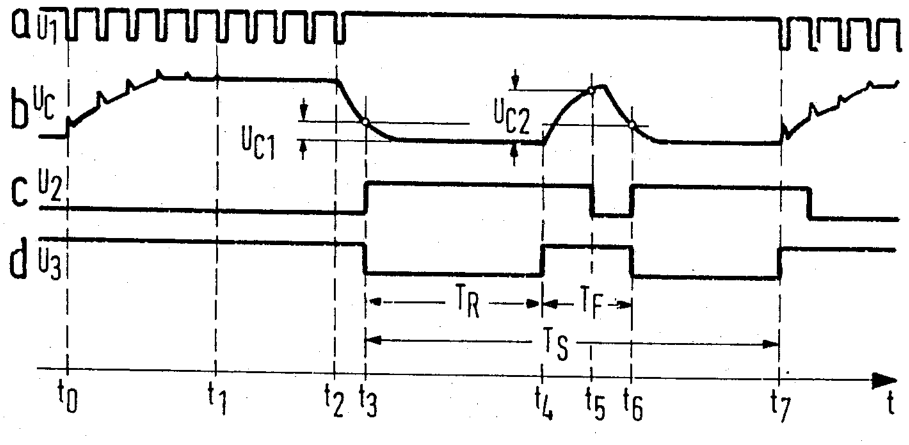

Finally, as may be seen from FIG. 3, beyond time $t_7$, after the malfunction period $T_s$ has elapsed, the circuitry will automatically resume normal operation if the malfunction is no longer occurring. This is particularly true if the equipment starts up again during the active phase in the period $T_F$ and it is then ascertained that the malfunction no longer exists.

Figure 2:
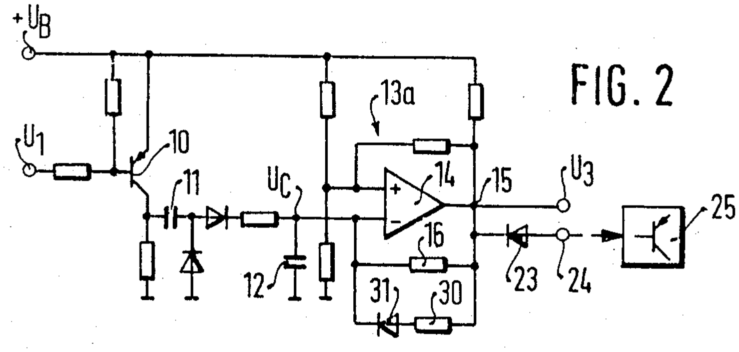
FIG. 2 is a circuit diagram for a second exemplary embodiment of a device according to the invention; and FIGS. *3a–3d* are time diagrams of signals, which are intended for explaining the circuits shown in FIGS. 1 and 2.

In the further exemplary embodiment shown in FIG. 2, the essential difference from the exemplary embodiment of FIG. 1 is that the functioning of the monostable multivibrator 18 of FIG. 1 is incorporated with the preceding threshold stage by making additional provisions in terms of circuitry. The remaining components are entirely identical with those of the embodiment of FIG. 1 and are therefore identified by the same reference numerals.

Differing from FIG. 1, the threshold stage 13*a*, in its negative coupling branch parallel to the resistor 16, additionally has only the series circuit comprising a resistor 30 and a diode 31. If there is a logical L level at the output 15, the storage capacitor 12 is thus discharged via the resistor 16, while with a logical H level at the output 15 it is charged via the parallel circuit of the resistors 16 and 30. The switching times and thus the duty cycle can thus be adjusted freely over a wide range via the selection of the resistors 16 and 30.

The foregoing relates to preferred exemplary embodiments of the invention, it being understood that other variants and embodiments thereof are possible within the spirit and scope of the invention, the latter being defined by the appended claims.

What is claimed and desired to be secured by Letters Patent of the United States is:

1. An apparatus for monitoring a series of control pulses generated by a microprocessor, said microprocessor producing a normal operation signal for controlling electronic equipment during a normal operation mode, and for controlling said electronic equipment in an emergency operation mode comprising, a capacitive means connected to receive at its input said control pulses from the microprocessor, a threshold circuit means having its inputs connected to outputs of the capacitive means to receive said control pulses and an output connected to a control means, said threshold circuit means being adapted to generate a periodic signal having two phases of differing durations in periodic sequence upon said control pulses failing to be received, thus indicating a failure of said microprocessor to supply said normal operation signal, said control means serving to control said differing durations of said periodic signal to provide a reset phase (TR) and an active phase (TF) and to produce a duration of said reset phase longer than a duration of said active phase, the reset phase of said periodic signal serving to reset said microprocessor and to block said electronic equipment, and the active phase of said periodic signal serving to restart the microprocessor and to control said electronic equipment, whereby said apparatus takes over control of the electronic equipment from the microprocessor during the emergency operation mode.

2. An apparatus as defined by claim 1, wherein said inputs of said threshold circuit means are inverting inputs and said capacitive means is connected to said inverting inputs of said threshold circuit means.

3. An apparatus as defined by claim 1, wherein said threshold circuit means includes a monostable multivibrator having an ON time of predetermined duration which determines the duration of the reset phase.

4. An apparatus as defined by claim 2, wherein said threshold circuit means includes a monostable multivibrator having an ON time of predetermined duration which determines the duration of the reset phase.

5. An apparatus as defined by claim 3, wherein said monostable multivibrator has an output connected to said capacitive means and serves to re-charge said capacitive means upon completion of the ON time of the multivibrator.

6. An apparatus as defined by claim 4, wherein said monostable multivibrator has an output connected to said capacitive means and serves to re-charge said capacitive means.

7. An apparatus as defined by claim 2, wherein said inverting inputs are connected to a charging branch and a discharging branch, each having different time constants.

8. An apparatus as defined by claim 3, wherein said monostable multivibrator directly controls said electronic equipment controlled by said microprocessor.

9. An apparatus as defined by claim 4, wherein said monostable multivibrator directly controls said electronic equipment controlled by said microprocessor.

10. An apparatus as defined by claim 5, wherein said monostable multivibrator directly controls said electronic equipment controlled by said microprocessor.

11. An apparatus as defined by claim 6, wherein said monostable multivibrator directly controls said electronic equipment controlled by said microprocessor.

12. An apparatus as defined by claim 7, wherein said monostable multivibrator directly controls said electronic equipment controlled by said microprocessor.

13. An apparatus as defined by claim 1, wherein said threshold circuit means directly controls said electronic equipment controlled by said microprocessor.

14. An apparatus as defined by claim 2, wherein said threshold circuit means directly controls said electronic equipment controlled by said microprocessor.

15. An apparatus as defined by claim 7, wherein said threshold circuit means directly controls said electronic equipment controlled by said microprocessor.

* * * * *